United States Patent
David et al.

(10) Patent No.: US 10,991,644 B2
(45) Date of Patent: Apr. 27, 2021

(54) INTEGRATED CIRCUIT PACKAGE HAVING A LOW PROFILE

(71) Applicant: Allegro MicroSystems, LLC, Manchester, NH (US)

(72) Inventors: Paul A. David, Bow, NH (US); Harry Chandra, Phoenix, AZ (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 26 days.

(21) Appl. No.: 16/547,814

(22) Filed: Aug. 22, 2019

(65) Prior Publication Data
US 2021/0057314 A1 Feb. 25, 2021

(51) Int. Cl.
*H01L 21/00* (2006.01)
*H01L 23/495* (2006.01)
(Continued)

(52) U.S. Cl.
CPC .... *H01L 23/49575* (2013.01); *G01R 33/0047* (2013.01); *G01R 33/07* (2013.01); *H01L 21/565* (2013.01); *H01L 23/31* (2013.01); *H01L 23/3135* (2013.01); *H01L 23/49541* (2013.01); *H01L 25/0652* (2013.01);
(Continued)

(58) Field of Classification Search
CPC ..... H01L 2924/181; H01L 2224/48247; H01L 2224/32145; H01L 23/49861; H01L 23/3107; H01L 21/56; H01L 23/3135; H01L 2224/04105; H01L 23/495; H01L 23/49589; H01L 31/0203; H01L 41/20; H01L 41/47; H01L 43/06; H01L 43/12; G01R 33/0047

USPC ................ 438/108, 111, 112, 123, 124, 127; 257/666, 676, 778, 787, 790
See application file for complete search history.

(56) References Cited

U.S. PATENT DOCUMENTS 3,195,043 A 7/1965 Burig et al.
3,281,628 A 10/1966 Bauer et al.
(Continued)

FOREIGN PATENT DOCUMENTS

CH 683 469 A5 3/1994
DE 40 31 560 A1 4/1992
(Continued)

OTHER PUBLICATIONS

U.S. Appl. No. 10/831,906, filed Apr. 26, 2004, Stauth et al.
(Continued)

*Primary Examiner* — David A Zarneke
(74) *Attorney, Agent, or Firm* — Daly Crowley Mofford & Durkee, LLP

(57) ABSTRACT

A method of providing a sensor IC package can include applying a film to a leadframe having first and second surfaces, mounting at least one component to the film, and applying a pre-mold material to cover at least a portion of the leadframe and the passive component while leaving a first side of the leadframe exposed. The film can be removed and a die attached to the first side of the leadframe. At least one electrical connection can be formed between the die and the leadframe. The assembly of the die, the leadframe, and the pre-mold material can be encapsulated with a final mold material to provide a low profile IC package.

38 Claims, 10 Drawing Sheets

(51) Int. Cl.
  *H01L 23/31* (2006.01)
  *H01L 21/56* (2006.01)
  *H01L 43/06* (2006.01)
  *H01L 43/12* (2006.01)
  *H01L 25/065* (2006.01)
  *G01R 33/07* (2006.01)
  *G01R 33/00* (2006.01)
  *H01L 31/0203* (2014.01)

(52) U.S. Cl.
  CPC .......... *H01L 31/0203* (2013.01); *H01L 43/06* (2013.01); *H01L 43/12* (2013.01)

(56) References Cited

U.S. PATENT DOCUMENTS

| | | |
|---|---|---|
| 3,627,901 A | 12/1971 | Happ |
| 3,661,061 A | 5/1972 | Tokarz |
| 4,048,670 A | 9/1977 | Eysermans |
| 4,188,605 A | 2/1980 | Stout |
| 4,204,317 A | 5/1980 | Winn |
| 4,210,926 A | 7/1980 | Hacke |
| 4,262,275 A | 4/1981 | DeMarco et al. |
| 4,283,643 A | 8/1981 | Levin |
| 4,315,523 A | 2/1982 | Mahawili et al. |
| 4,409,608 A | 10/1983 | Yoder |
| 4,425,596 A | 1/1984 | Satou |
| 4,614,111 A | 9/1986 | Wolff |
| 4,642,716 A | 2/1987 | Wakabayashi et al. |
| 4,733,455 A | 3/1988 | Nakamura et al. |
| 4,746,859 A | 5/1988 | Malik |
| 4,769,344 A | 9/1988 | Sakai et al. |
| 4,772,929 A | 9/1988 | Manchester |
| 4,893,073 A | 1/1990 | McDonald et al. |
| 4,908,685 A | 3/1990 | Shibasaki et al. |
| 4,935,698 A | 6/1990 | Kawaji et al. |
| 4,994,731 A | 2/1991 | Sanner |
| 5,010,263 A | 4/1991 | Murata |
| 5,012,322 A | 4/1991 | Guillotte et al. |
| 5,021,493 A | 6/1991 | Sandstrom |
| 5,028,868 A | 7/1991 | Murata et al. |
| 5,041,780 A | 8/1991 | Rippel |
| 5,045,920 A | 9/1991 | Vig et al. |
| 5,068,712 A | 11/1991 | Murakami et al. |
| 5,077,633 A | 12/1991 | Freyman et al. |
| 5,084,289 A | 1/1992 | Shin et al. |
| 5,121,289 A | 6/1992 | Gagliardi |
| 5,124,642 A | 6/1992 | Marx |
| 5,137,677 A | 8/1992 | Murata |
| 5,139,973 A | 8/1992 | Nagy et al. |
| 5,196,794 A | 3/1993 | Murata |
| 5,196,821 A | 3/1993 | Partin et al. |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,250,925 A | 10/1993 | Shinkle |
| 5,273,938 A * | 12/1993 | Lin .................. H01L 21/56 257/E21.502 |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,399,905 A | 3/1995 | Honda et al. |
| 5,414,355 A | 5/1995 | Davidson et al. |
| 5,434,105 A | 7/1995 | Liou |
| 5,442,228 A | 8/1995 | Pham et al. |
| 5,453,727 A | 9/1995 | Shibasaki et al. |
| 5,488,294 A | 1/1996 | Liddell et al. |
| 5,491,633 A | 2/1996 | Henry et al. |
| 5,500,589 A | 3/1996 | Sumcad |
| 5,508,611 A | 4/1996 | Schroeder et al. |
| 5,539,241 A | 7/1996 | Abidi et al. |
| 5,561,366 A | 10/1996 | Takahashi et al. |
| 5,563,199 A | 10/1996 | Harada et al. |
| 5,579,194 A | 11/1996 | Mackenzie et al. |
| 5,581,170 A | 12/1996 | Mammano et al. |
| 5,581,179 A | 12/1996 | Engel et al. |
| 5,612,259 A | 3/1997 | Okutomo et al. |
| 5,614,754 A | 3/1997 | Inoue |
| 5,615,075 A | 3/1997 | Kim |
| 5,627,315 A | 5/1997 | Figi et al. |
| 5,631,557 A | 5/1997 | Davidson |
| 5,648,682 A | 7/1997 | Nakazawa et al. |
| 5,666,004 A | 9/1997 | Bhattacharyya et al. |
| 5,691,869 A | 11/1997 | Engel et al. |
| 5,712,562 A | 1/1998 | Berg |
| 5,714,405 A | 2/1998 | Tsubosaki et al. |
| 5,719,496 A | 2/1998 | Wolf |
| 5,726,577 A | 3/1998 | Engel et al. |
| 5,729,130 A | 3/1998 | Moody et al. |
| 5,781,005 A | 7/1998 | Vig et al. |
| 5,804,880 A | 9/1998 | Mathew |
| 5,817,540 A | 10/1998 | Wark |
| 5,818,222 A | 10/1998 | Ramsden |
| 5,822,849 A | 10/1998 | Casali et al. |
| 5,859,387 A | 1/1999 | Gagnon |
| 5,883,567 A | 3/1999 | Mullins, Jr. |
| 5,891,377 A | 4/1999 | Libres et al. |
| 5,912,556 A | 6/1999 | Frazee et al. |
| 5,939,779 A | 8/1999 | Kim |
| 5,940,256 A | 8/1999 | MacKenzie et al. |
| 5,963,028 A | 10/1999 | Engel et al. |
| 5,973,388 A | 10/1999 | Chew et al. |
| 6,005,383 A | 12/1999 | Savary et al. |
| 6,016,055 A | 1/2000 | Jager et al. |
| 6,057,997 A | 5/2000 | MacKenzie et al. |
| 6,066,890 A | 5/2000 | Tsui et al. |
| 6,072,228 A | 6/2000 | Hinkle et al. |
| 6,097,109 A | 8/2000 | Fendt et al. |
| 6,150,714 A | 11/2000 | Andreycak et al. |
| 6,175,233 B1 | 1/2001 | McCurley et al. |
| 6,178,514 B1 | 1/2001 | Wood |
| 6,184,679 B1 | 2/2001 | Popovic et al. |
| 6,225,701 B1 | 5/2001 | Hori et al. |
| 6,252,389 B1 | 6/2001 | Baba et al. |
| 6,265,865 B1 | 7/2001 | Engel et al. |
| 6,278,269 B1 | 8/2001 | Vig et al. |
| 6,294,824 B1 | 9/2001 | Brooks et al. |
| 6,316,736 B1 | 11/2001 | Jairazbhoy et al. |
| 6,316,931 B1 | 11/2001 | Nakagawa et al. |
| 6,323,634 B1 | 11/2001 | Nakagawa et al. |
| 6,356,068 B1 | 3/2002 | Steiner et al. |
| 6,359,331 B1 | 3/2002 | Rinehart et al. |
| 6,388,336 B1 | 5/2002 | Venkateshwaren et al. |
| 6,396,712 B1 | 5/2002 | Kuijk |
| 6,411,078 B1 | 6/2002 | Nakagawa et al. |
| 6,420,779 B1 | 7/2002 | Sharma et al. |
| 6,424,018 B1 | 7/2002 | Ohtsuka |
| 6,429,652 B1 | 8/2002 | Allen et al. |
| 6,445,171 B2 | 9/2002 | Sandquist et al. |
| 6,452,381 B1 | 9/2002 | Nakatani et al. |
| 6,462,531 B1 | 10/2002 | Ohtsuka |
| 6,480,699 B1 | 11/2002 | Lovoi |
| 6,482,680 B1 | 11/2002 | Khor et al. |
| 6,486,535 B2 | 11/2002 | Liu |
| 6,501,268 B1 | 12/2002 | Edelstein et al. |
| 6,501,270 B1 | 12/2002 | Opie |
| 6,504,366 B2 | 1/2003 | Bodin et al. |
| 6,545,332 B2 | 4/2003 | Huang |
| 6,545,456 B1 | 4/2003 | Radosevich et al. |
| 6,545,457 B2 | 4/2003 | Goto et al. |
| 6,545,462 B2 | 4/2003 | Schott et al. |
| 6,563,199 B2 | 5/2003 | Yasunaga et al. |
| 6,566,856 B2 | 5/2003 | Sandquist et al. |
| 6,577,012 B1 | 6/2003 | Greenwood et al. |
| 6,583,572 B2 | 6/2003 | Veltrop et al. |
| 6,593,545 B1 | 7/2003 | Greenwood et al. |
| 6,605,491 B1 | 8/2003 | Hsieh et al. |
| 6,608,375 B2 | 8/2003 | Terui et al. |
| 6,610,923 B1 | 8/2003 | Nagashima et al. |
| 6,616,736 B2 | 9/2003 | Massey et al. |
| 6,617,846 B2 | 9/2003 | Hayat-Dawoodi et al. |
| 6,642,609 B1 | 11/2003 | Minamio et al. |
| 6,642,705 B2 | 11/2003 | Kawase |

(56) References Cited

U.S. PATENT DOCUMENTS

| | | | |
|---|---|---|---|
| 6,667,682 B2 | 12/2003 | Wan et al. |
| 6,683,448 B1 | 1/2004 | Ohtsuka |
| 6,683,452 B2 | 1/2004 | Lee et al. |
| 6,692,676 B1 | 2/2004 | Vig et al. |
| 6,696,952 B2 | 2/2004 | Zirbes |
| 6,713,836 B2 | 3/2004 | Liu et al. |
| 6,714,003 B2 | 3/2004 | Babin |
| 6,727,683 B2 | 4/2004 | Goto et al. |
| 6,737,298 B2 | 5/2004 | Shim et al. |
| 6,747,300 B2 | 6/2004 | Nadd et al. |
| 6,759,841 B2 | 7/2004 | Goto et al. |
| 6,770,163 B1 | 8/2004 | Kuah et al. |
| 6,775,140 B2 | 8/2004 | Shim et al. |
| 6,781,359 B2 | 8/2004 | Stauth et al. |
| 6,789,057 B1 | 9/2004 | Bolkin et al. |
| 6,791,313 B2 | 9/2004 | Ohtsuka |
| 6,796,485 B2 | 9/2004 | Seidler |
| 6,798,044 B2 | 9/2004 | Joshi |
| 6,798,057 B2 | 9/2004 | Bolkin et al. |
| 6,798,193 B2 | 9/2004 | Zimmerman et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,828,220 B2 | 12/2004 | Pendse et al. |
| 6,832,420 B2 | 12/2004 | Liu |
| 6,841,989 B2 | 1/2005 | Goto et al. |
| 6,853,178 B2 | 2/2005 | Hayat-Dawoodi |
| 6,861,283 B2 | 3/2005 | Sharma |
| 6,867,573 B1 | 3/2005 | Carper |
| 6,875,634 B2 | 4/2005 | Shim et al. |
| 6,921,955 B2 | 7/2005 | Goto et al. |
| 6,956,282 B1 | 10/2005 | Alvarez et al. |
| 6,960,493 B2 | 11/2005 | Ararao et al. |
| 6,974,909 B2 | 12/2005 | Tanaka et al. |
| 6,989,665 B2 | 1/2006 | Goto et al. |
| 6,995,315 B2 | 2/2006 | Sharma et al. |
| 7,005,325 B2 | 2/2006 | Chow et al. |
| 7,006,749 B2 | 2/2006 | Illich et al. |
| 7,026,808 B2 | 4/2006 | Vig et al. |
| 7,046,002 B1 | 5/2006 | Edelstein |
| 7,075,287 B1 | 7/2006 | Mangtani et al. |
| 7,129,691 B2 | 10/2006 | Shibahara et al. |
| 7,148,086 B2 | 12/2006 | Shim et al. |
| 7,166,807 B2 | 1/2007 | Gagnon et al. |
| 7,193,412 B2 | 3/2007 | Freeman |
| 7,221,045 B2 | 5/2007 | Park et al. |
| 7,248,045 B2 | 7/2007 | Shoji |
| 7,250,760 B2 | 7/2007 | Ao |
| 7,259,545 B2 | 8/2007 | Stauth et al. |
| 7,259,624 B2 | 8/2007 | Barnett |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,298,038 B2 * | 11/2007 | Filoteo, Jr. .......... H01L 23/3135 |
| | | 257/685 |
| 7,304,370 B2 | 12/2007 | Imaizumi et al. |
| 7,323,870 B2 | 1/2008 | Tatschl et al. |
| 7,355,388 B2 | 4/2008 | Ishio |
| 7,358,724 B2 | 4/2008 | Taylor et al. |
| 7,361,531 B2 | 4/2008 | Sharma et al. |
| 7,378,721 B2 | 5/2008 | Frazee et al. |
| 7,378,733 B1 | 5/2008 | Hoang et al. |
| 7,385,394 B2 | 6/2008 | Auburger et al. |
| 7,439,620 B2 * | 10/2008 | Merilo ................ H01L 23/3135 |
| | | 257/723 |
| 7,476,816 B2 | 1/2009 | Doogue et al. |
| 7,476,953 B2 | 1/2009 | Taylor et al. |
| 7,518,493 B2 | 4/2009 | Bryzek et al. |
| 7,557,563 B2 | 7/2009 | Gunn et al. |
| 7,573,112 B2 | 8/2009 | Taylor |
| 7,598,601 B2 | 10/2009 | Taylor et al. |
| 7,619,314 B2 * | 11/2009 | Filoteo, Jr. .......... H01L 23/3135 |
| | | 257/666 |
| 7,676,914 B2 | 3/2010 | Taylor |
| 7,687,882 B2 | 3/2010 | Taylor et al. |
| 7,696,006 B1 | 4/2010 | Hoang et al. |
| 7,709,754 B2 | 5/2010 | Doogue et al. |
| 7,768,083 B2 | 8/2010 | Doogue et al. |
| 7,777,607 B2 | 8/2010 | Taylor et al. |
| 7,816,772 B2 * | 10/2010 | Engel ...................... H01L 21/56 |
| | | 257/676 |
| 7,816,905 B2 | 10/2010 | Doogue et al. |
| 7,868,471 B2 * | 1/2011 | Camacho .......... H01L 23/49575 |
| | | 257/790 |
| 7,939,372 B1 | 5/2011 | Chang |
| 8,043,894 B2 * | 10/2011 | Tay ........................ H01L 25/03 |
| | | 438/109 |
| 8,080,994 B2 | 12/2011 | Taylor et al. |
| 8,093,670 B2 | 1/2012 | Taylor |
| 8,143,169 B2 | 3/2012 | Engel et al. |
| 8,629,539 B2 | 1/2014 | Milano et al. |
| 8,820,160 B2 * | 9/2014 | Doering ............... G01D 11/245 |
| | | 73/504.12 |
| 9,201,123 B2 * | 12/2015 | Elian ................... G01R 33/0047 |
| 9,228,860 B2 | 1/2016 | Sharma et al. |
| 9,283,772 B2 | 3/2016 | Perez Gellida et al. |
| 9,299,915 B2 | 3/2016 | Milano et al. |
| 9,411,025 B2 * | 8/2016 | David ................. G01R 33/0047 |
| 9,494,660 B2 | 11/2016 | David et al. |
| 9,620,705 B2 | 4/2017 | Milano et al. |
| 9,812,588 B2 | 11/2017 | Vig et al. |
| 10,234,513 B2 | 3/2019 | Vig et al. |
| 10,333,055 B2 | 6/2019 | Milano et al. |
| 2001/0028114 A1 | 10/2001 | Hosomi |
| 2001/0028115 A1 | 10/2001 | Yanagawa et al. |
| 2001/0030537 A1 | 10/2001 | Honkura et al. |
| 2001/0052780 A1 | 12/2001 | Hayat-Dawoodi |
| 2002/0005780 A1 | 1/2002 | Ehrlich et al. |
| 2002/0020907 A1 | 2/2002 | Seo et al. |
| 2002/0027488 A1 | 3/2002 | Hayat-Dawoodi et al. |
| 2002/0041179 A1 | 4/2002 | Gohara et al. |
| 2002/0068379 A1 | 6/2002 | Cobbley et al. |
| 2002/0179987 A1 | 12/2002 | Meyer et al. |
| 2002/0195693 A1 | 12/2002 | Liu et al. |
| 2003/0038464 A1 | 2/2003 | Furui |
| 2003/0039062 A1 | 2/2003 | Takahasahi |
| 2003/0067057 A1 | 4/2003 | Wu |
| 2003/0164548 A1 | 9/2003 | Lee |
| 2003/0209784 A1 | 11/2003 | Schmitz et al. |
| 2003/0230792 A1 | 12/2003 | Wu et al. |
| 2004/0032251 A1 | 2/2004 | Zimmerman et al. |
| 2004/0038452 A1 | 2/2004 | Pu |
| 2004/0046248 A1 | 3/2004 | Waelti et al. |
| 2004/0056647 A1 | 3/2004 | Stauth et al. |
| 2004/0080308 A1 | 4/2004 | Goto |
| 2004/0080314 A1 | 4/2004 | Tsujii et al. |
| 2004/0094826 A1 | 5/2004 | Yang et al. |
| 2004/0135220 A1 | 7/2004 | Goto |
| 2004/0135574 A1 | 7/2004 | Hagio et al. |
| 2004/0145043 A1 | 7/2004 | Hayashi et al. |
| 2004/0155644 A1 | 8/2004 | Stauth et al. |
| 2004/0174655 A1 | 9/2004 | Tsai et al. |
| 2004/0184196 A1 | 9/2004 | Jayasekara |
| 2004/0207035 A1 | 10/2004 | Witcraft et al. |
| 2004/0207077 A1 | 10/2004 | Leal et al. |
| 2004/0207398 A1 | 10/2004 | Kudo et al. |
| 2004/0207400 A1 | 10/2004 | Witcraft et al. |
| 2004/0212053 A1 | 10/2004 | Koh et al. |
| 2004/0222503 A1 | 11/2004 | Lee et al. |
| 2004/0251557 A1 | 12/2004 | Kee |
| 2004/0262718 A1 | 12/2004 | Ramakrishna |
| 2004/0263148 A1 | 12/2004 | Takabatake |
| 2005/0035448 A1 | 2/2005 | Hsu et al. |
| 2005/0040814 A1 | 2/2005 | Vig et al. |
| 2005/0045359 A1 | 3/2005 | Doogue et al. |
| 2005/0139972 A1 | 6/2005 | Chiu et al. |
| 2005/0151448 A1 | 7/2005 | Hikida et al. |
| 2005/0167790 A1 | 8/2005 | Khor et al. |
| 2005/0173783 A1 | 8/2005 | Chow et al. |
| 2005/0194676 A1 | 9/2005 | Fukuda et al. |
| 2005/0224248 A1 | 10/2005 | Gagnon et al. |
| 2005/0230843 A1 | 10/2005 | Williams |
| 2005/0236698 A1 | 10/2005 | Ozawa et al. |
| 2005/0248005 A1 | 11/2005 | Hayat-Dawoodi |

(56) References Cited

U.S. PATENT DOCUMENTS

| | | |
|---|---|---|
| 2005/0248336 A1 | 11/2005 | Sharma et al. |
| 2005/0253507 A1 | 11/2005 | Fujimura et al. |
| 2005/0266611 A1 | 12/2005 | Tu et al. |
| 2005/0270748 A1 | 12/2005 | Hsu |
| 2005/0274982 A1 | 12/2005 | Ueda et al. |
| 2005/0280411 A1 | 12/2005 | Bicking |
| 2006/0002147 A1 | 1/2006 | Hong et al. |
| 2006/0033487 A1 | 2/2006 | Nagano et al. |
| 2006/0038289 A1 | 2/2006 | Hsu et al. |
| 2006/0038560 A1 | 2/2006 | Kurumado |
| 2006/0068237 A1 | 3/2006 | Murphy et al. |
| 2006/0071655 A1 | 4/2006 | Shoji |
| 2006/0077598 A1 | 4/2006 | Taylor et al. |
| 2006/0091993 A1 | 5/2006 | Shoji |
| 2006/0113988 A1 | 6/2006 | Hall et al. |
| 2006/0114098 A1 | 6/2006 | Shoji |
| 2006/0145690 A1 | 7/2006 | Shoji |
| 2006/0152210 A1 | 7/2006 | Mangtani et al. |
| 2006/0170529 A1 | 8/2006 | Shoji |
| 2006/0175674 A1 | 8/2006 | Taylor et al. |
| 2006/0181263 A1 | 8/2006 | Doogue et al. |
| 2006/0219436 A1 | 10/2006 | Taylor et al. |
| 2006/0238190 A1 | 10/2006 | Ishio |
| 2006/0255797 A1 | 11/2006 | Taylor et al. |
| 2006/0261801 A1 | 11/2006 | Busch |
| 2006/0267135 A1 | 11/2006 | Wolfgang et al. |
| 2006/0291106 A1 | 12/2006 | Shoji |
| 2007/0007631 A1 | 1/2007 | Knittl |
| 2007/0018290 A1 | 1/2007 | Punzalan et al. |
| 2007/0018642 A1 | 1/2007 | Ao |
| 2007/0044370 A1 | 3/2007 | Shoji |
| 2007/0076332 A1 | 4/2007 | Shoji |
| 2007/0085174 A1 | 4/2007 | Wheless, Jr. et al. |
| 2007/0090825 A1 | 4/2007 | Shoji |
| 2007/0096716 A1 | 5/2007 | Shoji |
| 2007/0099348 A1 | 5/2007 | Sharma et al. |
| 2007/0138651 A1 | 6/2007 | Hauenstein |
| 2007/0170533 A1 | 7/2007 | Doogue et al. |
| 2007/0188946 A1 | 8/2007 | Shoji |
| 2007/0241423 A1 | 10/2007 | Taylor et al. |
| 2007/0243705 A1 | 10/2007 | Taylor |
| 2007/0279053 A1 | 12/2007 | Taylor et al. |
| 2008/0013298 A1 | 1/2008 | Sharma et al. |
| 2008/0018261 A1 | 1/2008 | Kastner |
| 2008/0034582 A1 | 1/2008 | Taylor |
| 2008/0036453 A1 | 2/2008 | Taylor |
| 2008/0230879 A1 | 9/2008 | Sharma et al. |
| 2008/0237818 A1 | 10/2008 | Engel et al. |
| 2008/0297138 A1 | 12/2008 | Taylor et al. |
| 2008/0308886 A1 | 12/2008 | Ausserlechner et al. |
| 2009/0058412 A1 | 3/2009 | Taylor et al. |
| 2009/0083963 A1 | 4/2009 | Otremba |
| 2009/0102034 A1 | 4/2009 | Pagkaliwangan et al. |
| 2009/0121704 A1 | 5/2009 | Shibahara |
| 2009/0122437 A1 | 5/2009 | Gong et al. |
| 2009/0140725 A1 | 6/2009 | Ausserlechner |
| 2009/0152696 A1 | 6/2009 | Dimasacat et al. |
| 2010/0019332 A1 | 1/2010 | Taylor |
| 2010/0141249 A1* | 6/2010 | Ararao ............... H01L 43/02 |
| | | 324/244 |
| 2010/0188078 A1 | 7/2010 | Foletto et al. |
| 2010/0201356 A1 | 8/2010 | Koller et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0031947 A1 | 2/2011 | You |
| 2011/0050222 A1 | 3/2011 | Ueno et al. |
| 2011/0068447 A1 | 3/2011 | Camacho et al. |
| 2011/0068779 A1 | 3/2011 | Werth et al. |
| 2011/0127998 A1 | 6/2011 | Elain et al. |
| 2011/0133732 A1 | 6/2011 | Sauber |
| 2011/0175598 A1 | 7/2011 | Doering et al. |
| 2011/0204887 A1 | 8/2011 | Ausserlechner et al. |
| 2011/0267039 A1 | 11/2011 | Musselman et al. |
| 2011/0304327 A1 | 12/2011 | Ausserlechner |
| 2012/0013333 A1 | 1/2012 | Ararao et al. |
| 2012/0086090 A1 | 4/2012 | Sharma et al. |
| 2012/0153446 A1 | 6/2012 | Jiang |
| 2012/0153447 A1 | 6/2012 | Jiang |
| 2013/0026615 A1 | 1/2013 | Gong et al. |
| 2015/0325559 A1* | 11/2015 | Niu ............... H01L 23/3135 |
| | | 257/675 |
| 2017/0148692 A1 | 5/2017 | Pavier et al. |
| 2019/0157465 A1 | 5/2019 | Vig et al. |
| 2020/0408854 A1* | 12/2020 | Offermann ......... G01R 33/0047 |

FOREIGN PATENT DOCUMENTS

| | | |
|---|---|---|
| DE | 4 141 386 A1 | 6/1993 |
| DE | 102 31 194 A1 | 2/2004 |
| DE | 103 14 602 A1 | 10/2004 |
| DE | 10 2004 054 317 | 5/2006 |
| DE | 10 2004 060 298 A1 | 6/2006 |
| DE | 10 2007 018 238 A1 | 10/2008 |
| DE | 10 2008 064 047 A1 | 4/2010 |
| DE | 10 2009 000 460 A1 | 7/2010 |
| EP | 0 361 456 A2 | 4/1990 |
| EP | 0 409 173 A2 | 1/1991 |
| EP | 0 537 419 A1 | 4/1993 |
| EP | 0 680 103 A1 | 11/1995 |
| EP | 0 867 725 A1 | 9/1998 |
| EP | 0 898 180 A2 | 2/1999 |
| EP | 1 107 327 A2 | 6/2001 |
| EP | 1 107 328 A2 | 6/2001 |
| EP | 1 111 693 A2 | 6/2001 |
| EP | 1 160 887 A2 | 12/2001 |
| EP | 1 180 804 A2 | 2/2002 |
| EP | 1 281 974 A2 | 2/2003 |
| EP | 1 443 332 A1 | 8/2004 |
| EP | 0 944 839 B1 | 3/2006 |
| EP | 2 366 976 A1 | 9/2011 |
| FR | 2 748 105 A1 | 10/1997 |
| GB | 2 191 632 A | 12/1987 |
| GB | 2 273 782 A | 6/1994 |
| JP | S 54-182859 U | 12/1979 |
| JP | S 63-84176 A | 4/1988 |
| JP | 63-191069 A | 8/1988 |
| JP | 63-263782 A | 10/1988 |
| JP | 1-184885 A | 7/1989 |
| JP | 1-207909 | 8/1989 |
| JP | 4-152688 | 5/1992 |
| JP | 4-364472 A | 12/1992 |
| JP | 6-171649 A | 6/1994 |
| JP | 8-97486 A | 4/1996 |
| JP | H 08-264569 A | 10/1996 |
| JP | 9-079865 A | 3/1997 |
| JP | 9-166612 | 6/1997 |
| JP | H 09-232373 A | 9/1997 |
| JP | H 11-74142 A | 3/1999 |
| JP | 2000-174357 A | 6/2000 |
| JP | 2000-183241 A | 6/2000 |
| JP | 2000-294692 A | 10/2000 |
| JP | 2001-116815 A | 4/2001 |
| JP | 2001-141738 A | 5/2001 |
| JP | 2001-165702 A | 6/2001 |
| JP | 2001-165963 A | 6/2001 |
| JP | 2001-174486 A | 6/2001 |
| JP | 2001-221815 A | 8/2001 |
| JP | 2001-230467 A | 8/2001 |
| JP | 2001-339109 A | 12/2001 |
| JP | 2002-026419 A | 1/2002 |
| JP | 2002-040058 A | 2/2002 |
| JP | 2002-202326 A | 7/2002 |
| JP | 2002-202327 A | 7/2002 |
| JP | 2003-177171 A | 6/2003 |
| JP | 2004-055932 A | 2/2004 |
| JP | 2004-356338 A | 12/2004 |
| JP | 2005-327859 A | 11/2005 |
| JP | 2005-345302 A | 12/2005 |
| JP | 2007-218799 A | 8/2007 |
| JP | 2008-513632 A | 5/2008 |
| JP | 4-357858 B2 | 11/2009 |
| TW | I240978 B | 10/2005 |

(56) References Cited

FOREIGN PATENT DOCUMENTS

| | | |
|---|---|---|
| WO | WO 90/07176 | 6/1990 |
| WO | WO 99/14605 | 3/1999 |
| WO | WO 00/54068 A1 | 9/2000 |
| WO | WO 00/69045 | 11/2000 |
| WO | WO 01/23899 A1 | 4/2001 |
| WO | WO 01/74139 A2 | 10/2001 |
| WO | WO 03/107018 A1 | 12/2003 |
| WO | WO 2004/027436 A1 | 4/2004 |
| WO | WO 2005/013363 A2 | 2/2005 |
| WO | WO 2005/026749 A1 | 3/2005 |
| WO | WO 2006/037695 A1 | 4/2006 |
| WO | WO 2006/060330 A1 | 6/2006 |
| WO | WO 2006/083479 A1 | 8/2006 |
| WO | WO 2006/124252 | 11/2006 |
| WO | WO 2006/130393 A1 | 12/2006 |
| WO | WO 2007/053383 A2 | 5/2007 |
| WO | WO 2008/008140 A2 | 1/2008 |
| WO | WO 2008/121443 A1 | 10/2008 |
| WO | WO 2010/065315 A1 | 6/2010 |
| WO | WO 2011/068653 A1 | 6/2011 |
| WO | WO 2013/109355 A1 | 7/2013 |
| WO | WO 2013/141981 A2 | 9/2013 |
| WO | WO 2013/142112 A1 | 9/2013 |

OTHER PUBLICATIONS

U.S. Appl. No. 10/962,889, filed Oct. 12, 2004, Taylor et al.
U.S. Appl. No. 11/051,124, filed Feb. 4, 2005, Taylor et al.
U.S. Appl. No. 11/129,933, filed May 16, 2005, Taylor et al.
U.S. Appl. No. 11/140,250, filed May 27, 2005, Doogue et al.
U.S. Appl. No. 11/144,970, filed Jun. 3, 2005, Gagnon et al.
U.S. Appl. No. 11/335,944, filed Jan. 20, 2006, Doogue et al.
U.S. Appl. No. 11/336,602, filed Jan. 20, 2006, Mangtani et al.
U.S. Appl. No. 11/383,021, filed May 12, 2006, Taylor et al.
U.S. Appl. No. 11/401,160, filed Apr. 10, 2006, Doogue et al.
U.S. Appl. No. 11/457,626, filed Jul. 14, 2006, Sharma et al.
U.S. Appl. No. 11/776,242, filed Jul. 11, 2007, Taylor et al.
U.S. Appl. No. 12/171,651, filed Jul. 11, 2008, Taylor et al.
U.S. Appl. No. 12/178,781, filed Jul. 24, 2008, Taylor.
U.S. Appl. No. 12/261,629, filed Oct. 30, 2008, Taylor et al.
U.S. Appl. No. 12/360,889, filed Jan. 28, 2009, Foletto et al.
U.S. Appl. No. 13/241,380, filed Sep. 23, 2011, Ararao et al.

* cited by examiner

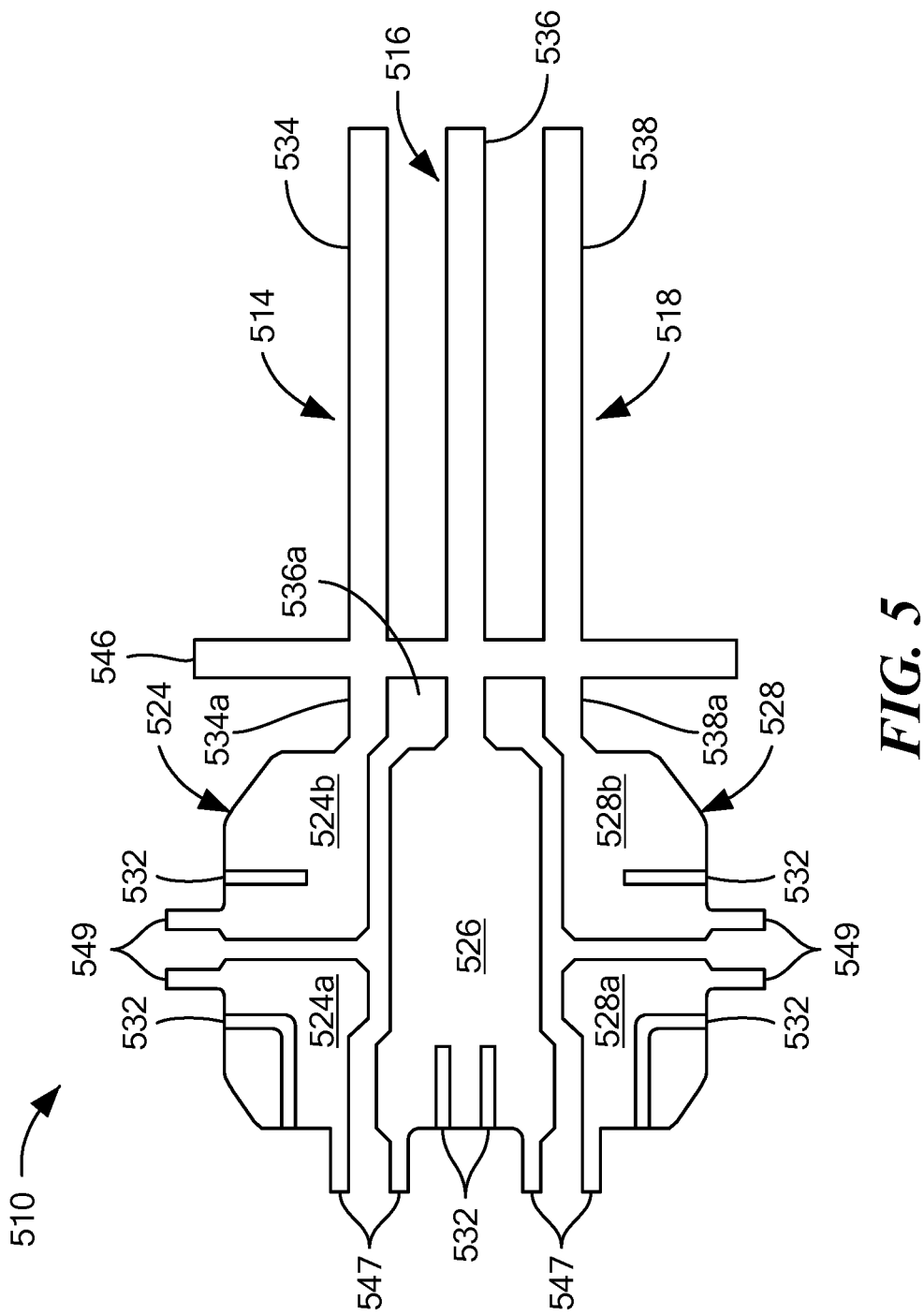

INTEGRATED CIRCUIT PACKAGE HAVING A LOW PROFILE

BACKGROUND OF THE INVENTION

Techniques for semiconductor packaging are well known in the art. In general, a semiconductor die is cut from a wafer, processed, and attached to a die attach pad of a lead frame. The subassembly may then be overmolded with a plastic or other insulative and protective material to form an integrated circuit (IC) package.

After packaging, the IC may then be placed on a circuit board with other ICs and components, including passive components such as capacitors, resistors, and inductors, which can be used for filtering and other functionality. For example, in the case of a magnetic field sensor integrated circuit containing a magnetic field sensing element, components such as capacitors are often required to reduce noise and enhance EMC (electromagnetic compatibility).

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Illustrative applications include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

In some applications it is desirable to provide a back bias magnet with magnetic poles on the magnet surface adjacent to the magnetic field transducer. For example, as described in a U.S. Pat. No. 5,781,005 entitled "Hall-Effect Ferromagnetic-Article-Proximity Sensor," which is incorporated by reference, the near presence of opposite poles serves to short out the lines of flux when no ferromagnetic article is present, thereby presenting a significant and easily recognizable difference between an article present (e.g., gear tooth present) condition and an article absent (e.g., gear valley present) condition and maintaining a low magnetic flux density baseline regardless of airgap. Because of the easily recognizable difference in the magnetic field signal, these types of arrangements are advantageous for use in sensors in which it is necessary to detect the presence/absence of a magnetic article, such sensors sometimes being referred to as True Power On Sensors, or TPOS sensors.

Generally, back bias magnets and concentrators are held in place relative to the magnetic field sensing element by mechanical means, such as an adhesive as shown in a U.S. Pat. No. 6,265,865 entitled "Single Unitary Plastic Package for a Magnetic Field Sensing Device," which is incorporated by reference. Other sensors are manufactured so that the sensor and the back bias magnet or concentrator are integrally formed. A magnetic field sensor of this type is described in a U.S. Patent Application Publication No. 2010/0141249 entitled "Magnetic Field Sensors and Methods for Fabricating the Magnetic Field Sensors," which is incorporated by reference, in which a concentrator or magnet may be formed by a liquid encapsulant or a combination of a liquid encapsulant and permanent magnet in a cavity on the side of the sensor opposite the target.

There are many package types and fabrication techniques in use for providing integrated circuit magnetic field sensors. For example, the semiconductor die in which the magnetic field sensing element is formed may be attached to a lead frame by various techniques, such as with an adhesive tape or epoxy, and may be electrically coupled to the lead frame by various techniques, such as with solder bumps or wire bonding. Also, the lead frame may take various forms and the semiconductor die may be attached to the lead frame in an orientation with the active semiconductor surface (i.e., the surface in which the magnetic field sensing element is formed) being adjacent to the lead frame in a so called "flip-chip" arrangement, with the active semiconductor surface opposite the lead frame surface in a so called "die up" arrangement, or with the semiconductor die positioned below the lead frame in a so called "lead on chip" arrangement.

Molding is often used in fabricating integrated circuit magnetic field sensors to provide the protective and electrically insulative overmold to the semiconductor die. Transfer molding has also been used to form two different molded portions for various reasons. For example, in a U.S. Pat. No. 7,816,772 entitled "Methods and Apparatus for Multi-Stage Molding of Integrated Circuit Package" which is incorporated by reference, a first molded structure is formed over the semiconductor die to protect wire bonds and the device is overmolded with a second molded structure formed over the first molded structure. In a U.S. Patent Application Publication No. 2009/0140725 entitled "Integrated Circuit Including Sensor having Injection Molded Magnetic Material," which is incorporated by reference, an injection molded magnetic material encloses at least a portion of a magnetic field sensor.

SUMMARY OF THE INVENTION

Embodiments of the invention may include the use of a film assist process to build a multi-part package with passive components to provide an IC package having a lower profile package than for conventional IC packages. An initial package assembly may or may not have a Silicon die and includes one or more passive components referenced on the same mounting plane as the leadframe.

In embodiments, a leadframe and components may be mounted on tape with a film assist process that keeps certain surfaces exposed for further processing. For example, wirebonds can be used to make desired electrical connections from a die to the leadframe. Further processing can include molding to enclose the wire bonds, leadframe and additional components to create the final package.

In one aspect, a method comprises: applying a film to a leadframe having first and second surfaces, wherein the film is applied to the second surface of the leadframe; mounting at least one component to the film; applying a pre-mold material to cover at least a portion of the first surface of the leadframe and the at least one component; removing the film to expose the second surface of the leadframe; attaching a die to the second surface of the leadframe; forming at least one electrical connection between the die and the leadframe; and encapsulating the die, the leadframe, the at least one component and the pre-mold material with a final mold material to provide an IC package.

A method can include one or more of the following features: attaching a magnet to the opposite side of the leadframe as the die, the at least one component comprises one or more of a capacitor, resistor, inductor, and/or coil, the at least one component comprises one or more active components, the one or more active component comprises a transistor, transducer, and/or circuit, a magnetic field sensing element coupled to the die, the at least one component and the leadframe are substantially co-planar, the at least one electrical connection comprises a wirebond, a thickness of the IC package is less than 1.25 mm, a total thickness of the leadframe and the pre-mold material is less than about 0.75 mm, a thickness of the leadframe is less than about 0.35 mm, the IC package has exactly two leads, the IC package has exactly three leads, attaching a magnet to the opposite side of the leadframe as the die, wherein the magnet abuts the pre-mold material, providing wirebonds between the die and the leadframe, applying the pre-mold material, and then providing wirebonds to the at least one component, which is on an opposite side of the leadframe as the die, the at least one component is secured in position by the pre-mold material, connecting the at least one component to the leadframe with a wirebond, the at least one component includes first and second passive components with respective wirebonds, and/or the portion of the leadframe attached to the die comprises a non-conductive material.

In another aspect, a method comprises: employing a film having first and second surfaces; mounting at least one component to the first surface of the film; mounting leadframe portions to the first surface of the film; applying a pre-mold material on the first surface of the film to cover at least a portion of the passive component and the at least one of the leadframe portions; removing the film; attaching a die to the pre-mold material; forming at least one electrical connection from the at least one component to one of the leadframe portions and/or the die; and encapsulating the die, the at least one component, and the pre-mold material with a final mold material to provide an IC package.

A method can further include one or more of the following features: the at least one component comprises one or more of a capacitor, resistor, inductor, coil, transistor, transducer and/or circuit, the die includes a magnetic field sensing element, the at least one electrical connection comprises a wirebond, a thickness of the IC package is less than 1.25 mm, providing wirebonds between the die and the leadframe portions, applying the pre-mold material, and then providing wirebonds to the at least one component, and/or the at least one component is secured in position by the pre-mold material.

In a further aspect, an IC package comprises: a leadframe having first and second surfaces; at least one component supported by the leadframe; a pre-mold material covering at least a portion of the first surface of the leadframe and the at least one component and securing the at least one component in position; a die supported by the second surface of the leadframe; at least one electrical connection between the die and the leadframe; and encapsulant encapsulating the die, the leadframe, the at least one component, and the pre-mold material to provide an IC package.

An IC package can further include one or more of the following features: a magnet on the opposite side of the leadframe as the die, the at least one component comprises one or more of a capacitor, resistor, inductor, coil, active component, transistor, transducer, and/or circuit, a magnetic field sensing element on or about the die, the at least one component and the leadframe are substantially co-planar, the at least one electrical connection comprises a wirebond, a thickness of the IC package is less than about 1.25 mm, a total thickness of the leadframe and the pre-mold material is less than about 0.75 mm, a thickness of the leadframe is less than about 0.35 mm, the IC package has exactly two leads, the IC package has exactly three leads, and/or a magnet at the opposite side of the leadframe as the die, wherein the magnet abuts the pre-mold material.

BRIEF DESCRIPTION OF THE DRAWINGS

The foregoing features of the invention, as well as the invention itself may be more fully understood from the following detailed description of the drawings, in which:

FIG. 5 is a schematic representation of example leadframe which can be secured to a film to provide a low-profile sensor IC package.

DETAILED DESCRIPTION

Figure 1A:
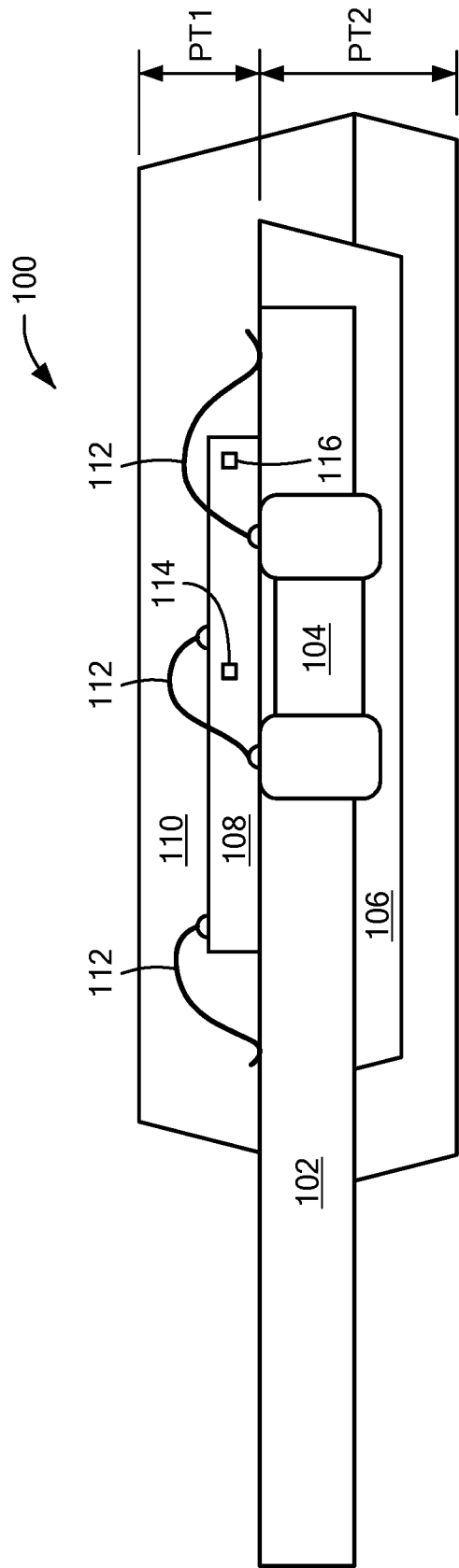
FIG. 1A is side view of a sensor IC package in accordance with example embodiments of the invention.

FIG. 1A shows an example integrated circuit (IC) package 100 fabricated with the use of a film in a multi-stage molding process in accordance with example embodiments of the invention to provide a lower profile than conventional IC packages. The IC package 100 includes a leadframe 102 generally in the same plane as a passive component 104, such as a capacitor. A pre-mold material 106 covers some of the leadframe 102 and the passive component 104. A die 108 is supported by the leadframe 102. A final mold material 110 encapsulates the die/leadframe assembly. Prior to encapsulation, wirebonds 112 can be formed to make electrical connections between the die 108 and the leadframe 102. The IC package 100 may include a magnetic sensing element 114, which may be formed on or about the die 108, and the die can include circuitry 116 to process information from the magnetic sensing element 114.

Figure 1B:
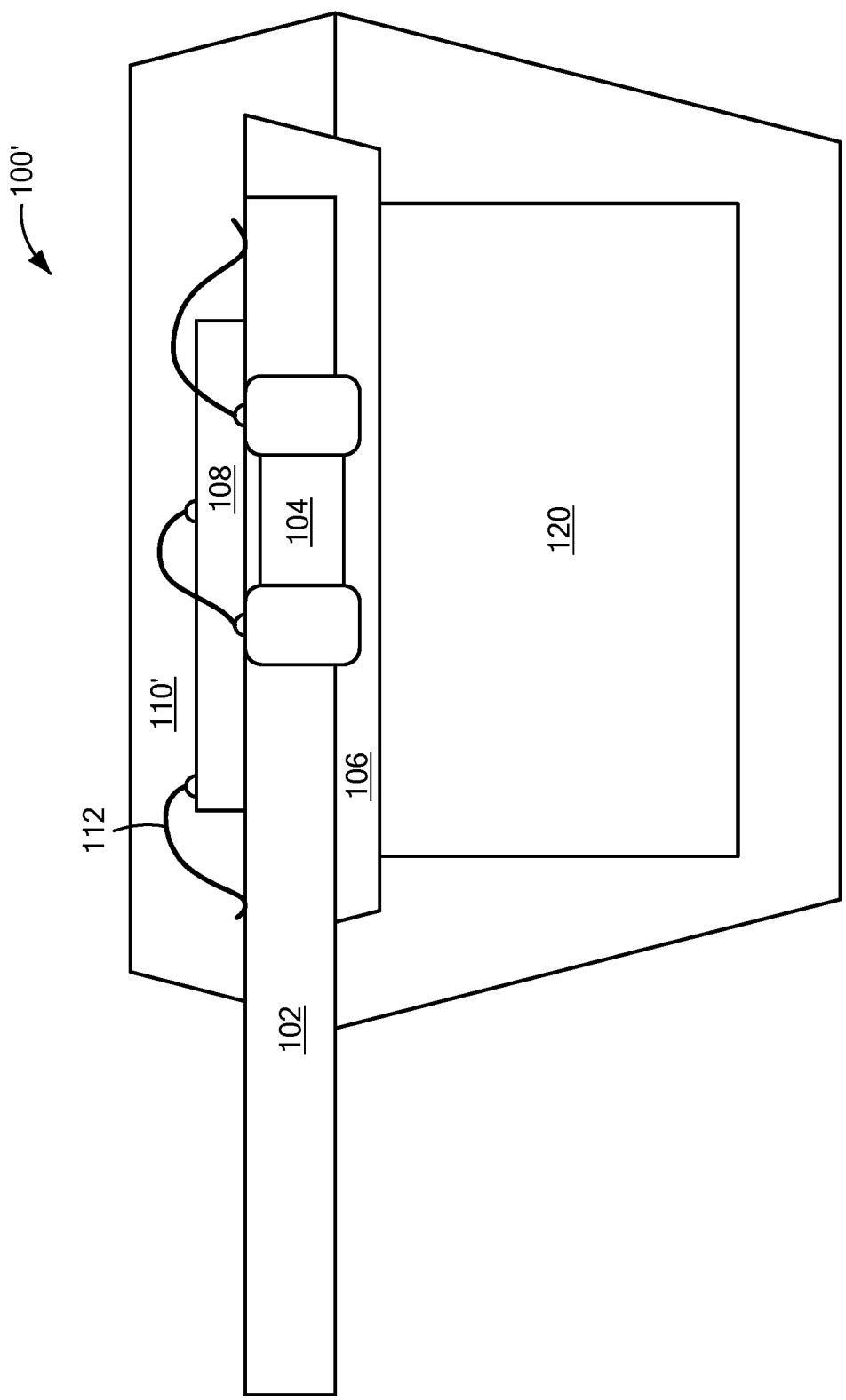
FIG. 1B is a side view of a further sensor IC package in accordance with example embodiments of the invention.

FIG. 1B shows an example IC package 100' similar to the sensor IC package 100 of FIG. 1B with the addition of a magnet 120 encapsulated within the final mold material 110'.

The magnet 120 can back bias the sensing element to meet the needs of a particular application.

Figure 2A:
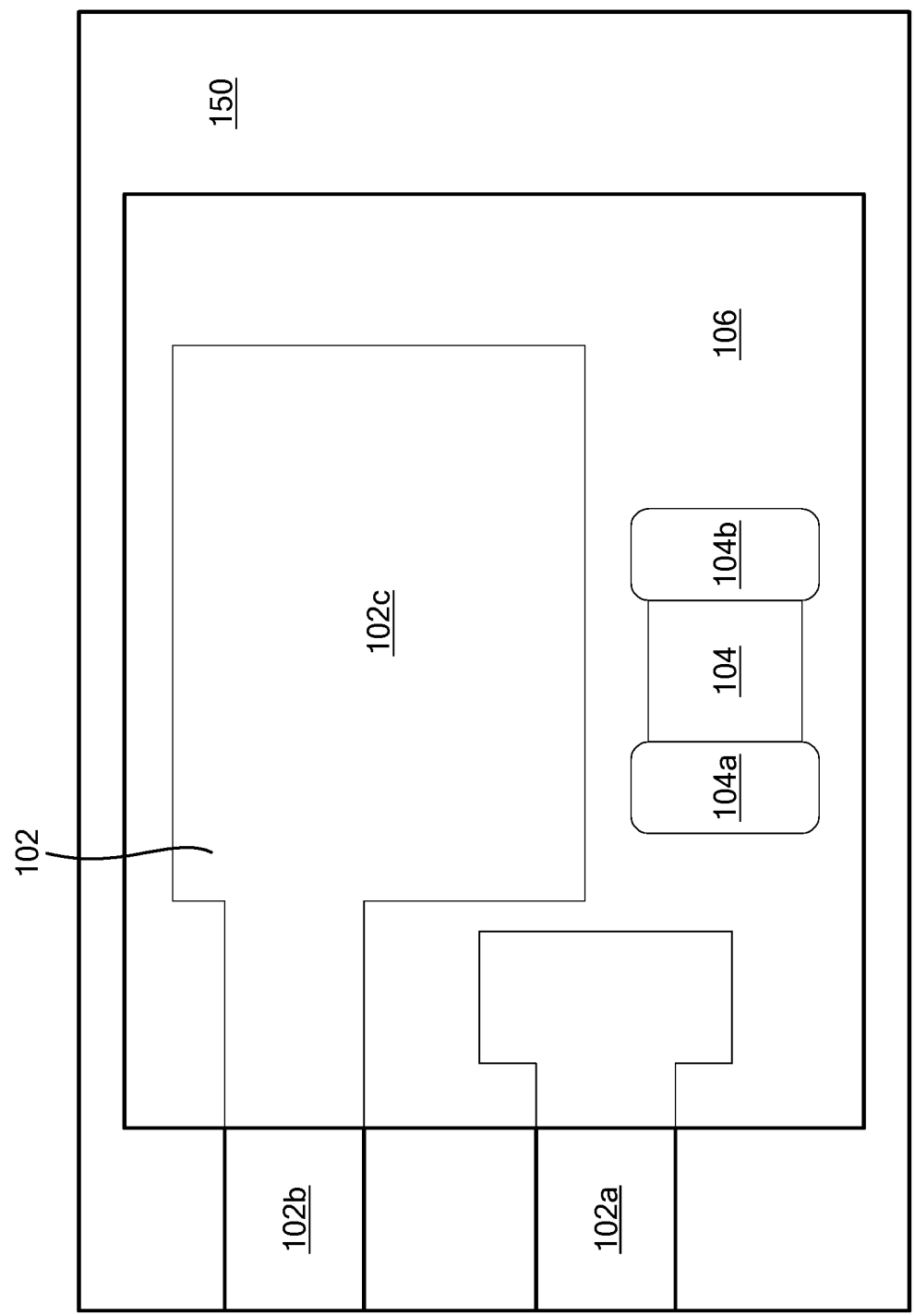
FIG. 2A is a top view of a sensor IC package at a first stage of assembly in accordance with example embodiments of the invention.
Figure 2B:
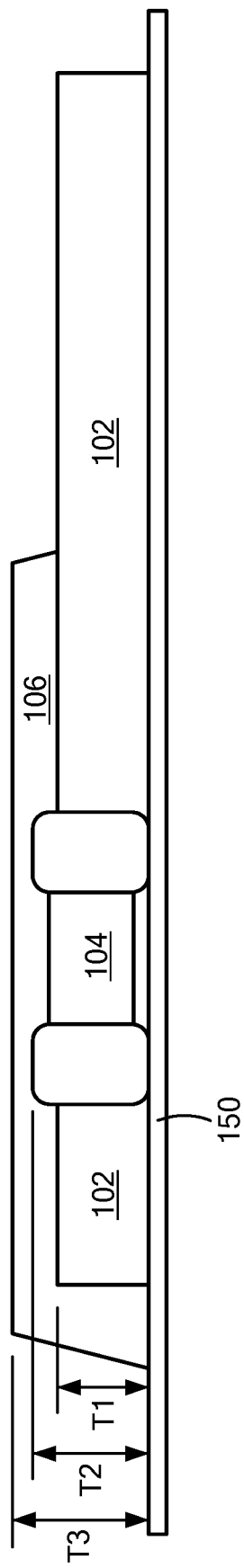
FIG. 2B is a side view of the sensor IC package at a first stage of assembly of FIG. 2A.

FIGS. 2A and 2B show an example assembly in a first stage of processing for the IC package 100 of FIG. 1A in which common reference numbers indicate like elements. The assembly includes a film 150 on which the leadframe 102 is supported. In example embodiments, the leadframe 102 can include a number of portions including an additional leadfinger 102a for external IO connections. Leadframe 102 can provide a die paddle to support the die 108. In example embodiments, the film 150 includes an adhesive to secure one side of the leadframe 102 to the film. The passive component 104 is also secured to the film 150. In the illustrated embodiment, the passive component 104 comprises a capacitor having first and second ends 104a, 104b that are larger in size than the middle portion so that only the ends are secured to the film 150.

The first mold material 106, which can also be referred to as pre-mold material, covers the lead frame portions 102 and passive component 104. As can be seen, leadframe portions can extend from the pre-mold material to provide external IO connections for the package. In embodiments, a surface of the leadframe 102 secured to the film 150 is left uncovered by the first mold material 106 to allow placement of a die on the leadframe. Removal of the film 150 enables placement of the die 108 (FIG. 1A) on the die paddle 102a of the leadframe 102, making wirebond connections 112 to the leadframe 102, and the like. In embodiments, the pre-mold 106 is applied in a film assist molding process. In example embodiments, a mold is clamped to the leadframe 102 and film 150 together. The film 150 can be held against a flat surface to support the film 150 and leadframe 102. In this case the passive component(s) 104 is also applied to the film/tape 150. The top cavity of the mold tool forms the shape of the pre-mold 106 during the injection process.

Figure 2D:
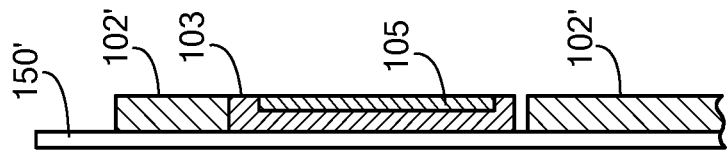
FIG. 2D is a cross-sectional view of the assembly of FIG. 2C.
Figure 2C:
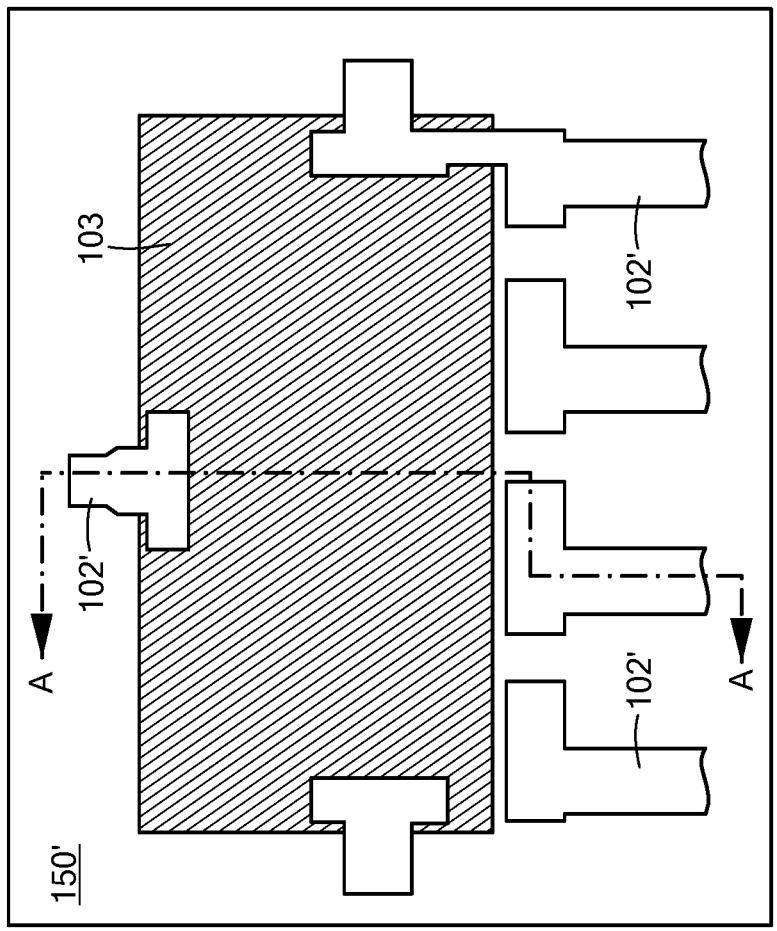
FIG. 2C is a top view of a sensor IC assembly having a non-conductive die paddle at a first stage of assembly in accordance with example embodiments of the invention.
Figure 2E:
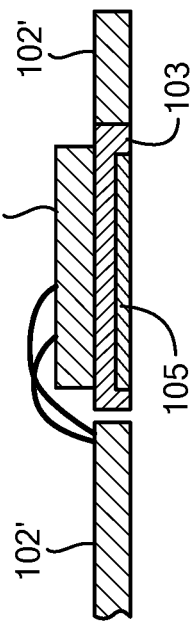
FIG. 2E is a cross-sectional view of the assembly of FIG. 2C with the addition of a die.

In some embodiments, a die can be supported by a non-conductive material instead of conductive leadframe material. For example, as shown in FIGS. 2C and 2D, conductive leadframe portions 102' and a non-conductive die paddle 103 can be secured to a film 150'. A capacitor 104 can also be placed on the film. The die-supporting portion 102a of the leadframe in FIG. 2A, which comprises a conductive material such as plastic, can be replaced by the non-conductive die paddle 103. The non-conductive die paddle 103 can be secured to the film 150 along with the lead frame portions 102 and passive component 104. An optional magnetic layer 105 can be provided in the die paddle 103. A pre-mold material (not shown) can cover a portion of the lead frame portions and component 104, as described above, after which the film 150' can be removed. As shown in FIG. 2E, a die 108' can be secured to the assembly after which overmolding can be performed.

It should be noted that any practical number of components, such as the capacitor 104 shown in FIG. 2B, can be added to the embodiments of FIGS. 2C-2E. In one embodiment, the die paddle 103 is not connected to the leads. In other embodiments, the die paddle 103 is connected to the leads.

It is understood that the die paddle 103 can comprise a material, such as epoxy mold compound premolded, a metal, for example a piece of copper, in one embodiment as a portion of the leadframe, or a ferromagnetic material, including but not limited to a soft ferromagnetic material, such as a permalloy or a steel, or any other suitable material. In another embodiment the die paddle 103 is pre-molded to leave an opening for a component, such as the capacitor 104 of FIG. 2B to be electrically connected, including, but not limited to, by wire bonding. In embodiments, the pre-mold (106 of FIG. 2A) can form the non-conductive die paddle 103 so that the die is attached to the premold 106 by a material such as an epoxy and then wire bonded to the die-side of the leads after pre-mold 106 application and before overmolding with encapsulant. The film 150 can be removed prior to die attach, wire bonding, and overmolding the assembly.

In another embodiment the die may be attached to leads using a flip-chip technology, for example, using solder or other reflowable electrical material to connect the die to the leads of the leadframe which is secured by the pre-mold material. In such a case, a wire bond may be used to connect a leadframe portion to a passive element such as capacitor. This may be two different lead portions, for example, to connect the passive element between two leads. It should be noted that this connection also places the capacitor between two bonding pads of the die, where the two bonding pads are connected to the same lead portions by the solder bumps or other conductive elements.

In embodiments, the conductive leadframe material 102' is outside a perimeter of the die 108 (FIGS. 2C-2E). The nonconductive die paddle 103 eliminates conductive material, e.g., copper, behind the magnetic sensing element for reducing eddy currents and increasing sensor performance.

Figure 3A:
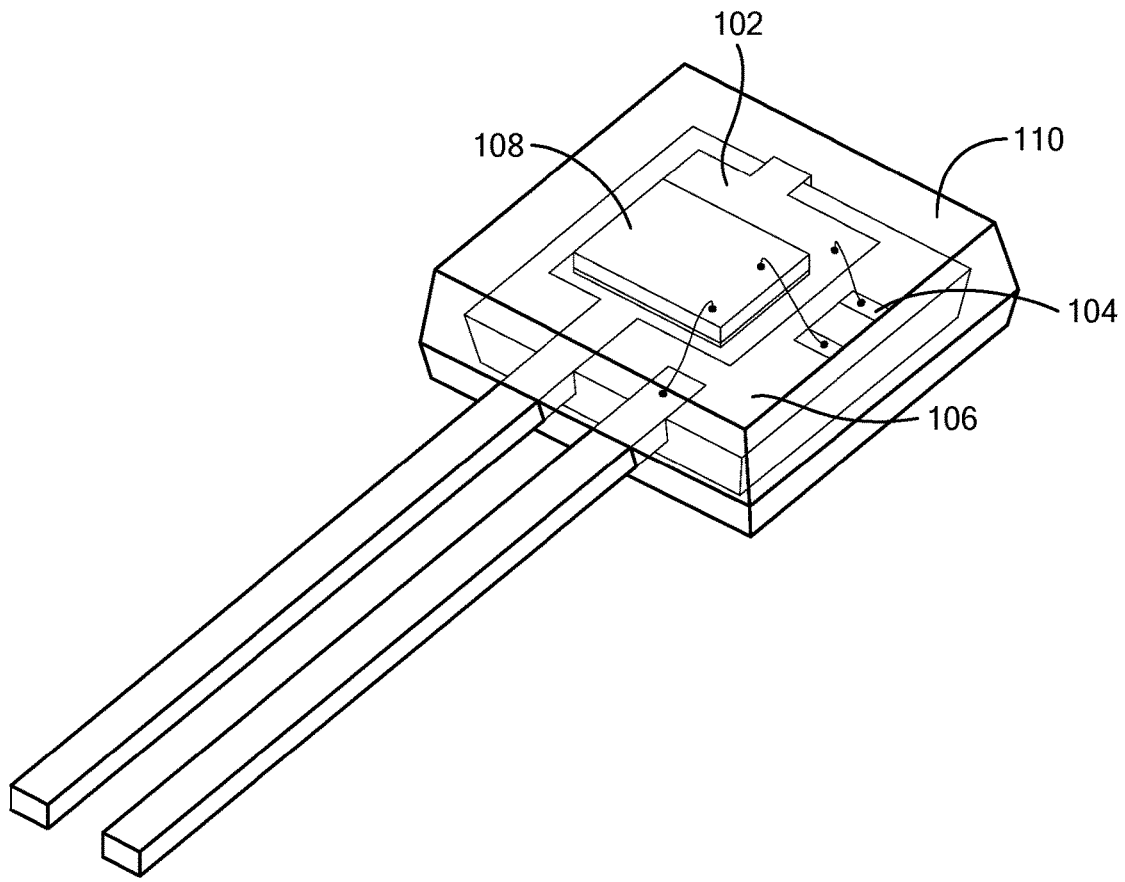
FIG. 3A is a partially transparent view of a sensor IC package fabricated in accordance with example embodiments of the invention.
Figure 3B:
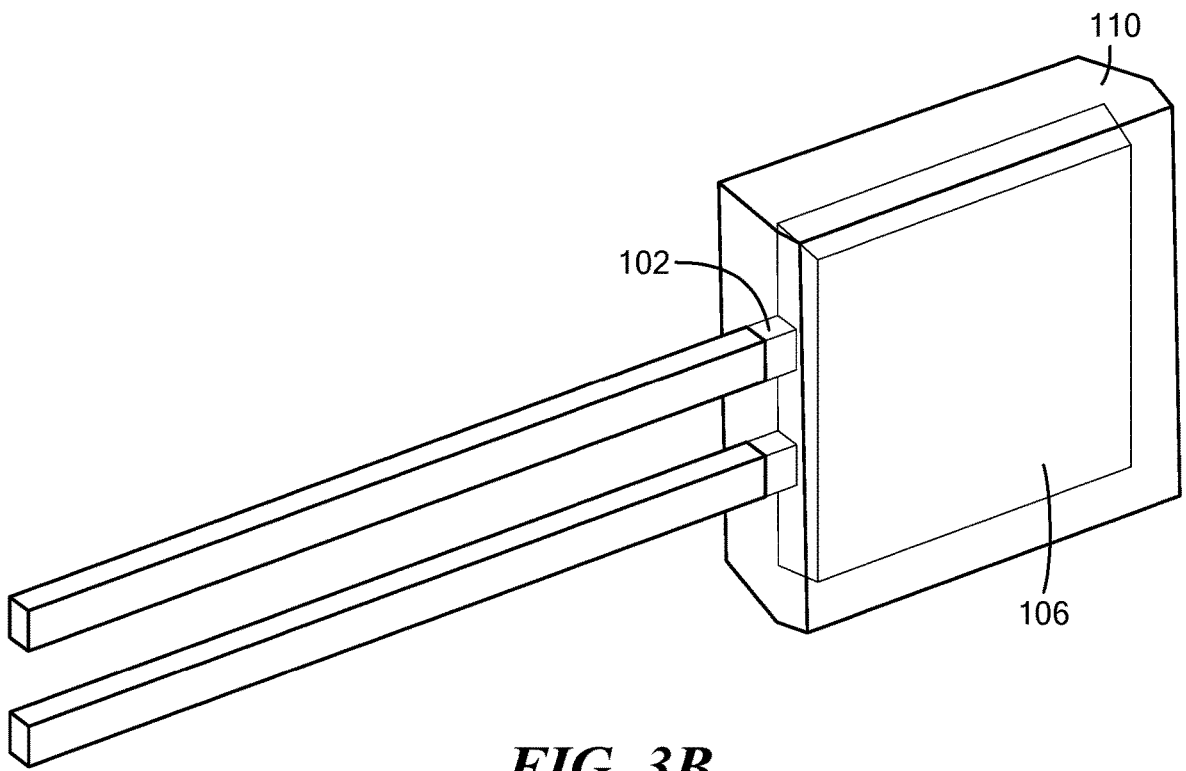
FIG. 3B is perspective view from the back of the sensor IC package of FIG. 3A.
Figure 3C:
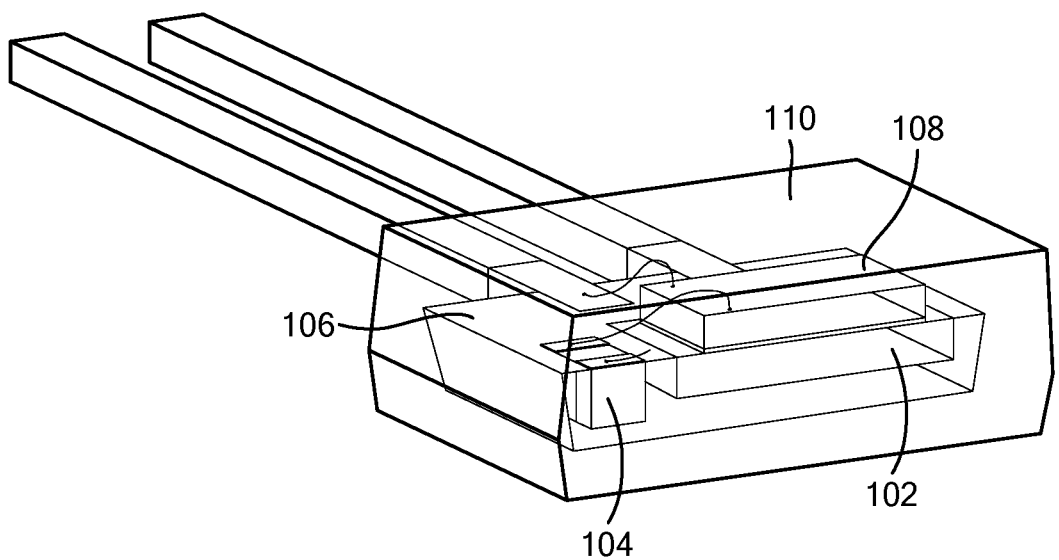
FIG. 3C is a cross-sectional view along a first section line of the sensor IC package of FIG. 3A.
Figure 3D:
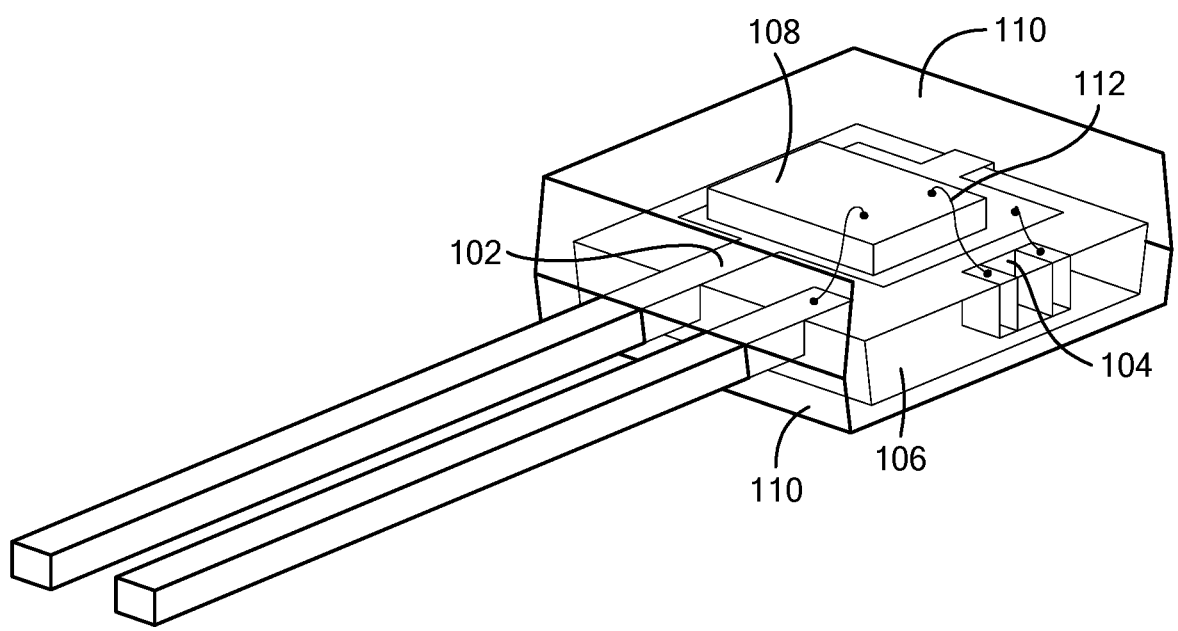
FIG. 3D is a cross-sectional view along a second section line of the sensor IC package of FIG. 3A.

FIGS. 3A-3D show an example sensor IC package after removal of the film, placement of the die 108, and application of the encapsulant 110, which can be referred to as overmold material. over the die 108 and pre-mold material 106. FIG. 3A is a partially transparent perspective view of a sensor IC package fabricated in accordance with example embodiments of the invention. FIG. 3B shows a partially transparent back view of the sensor IC package of FIG. 3A. FIG. 3C shows a partially transparent cross-sectional view along a first section line and FIG. 3D shows a partially transparent cross-sectional view along a second section line, which is perpendicular to the first section line.

Figure 3E:
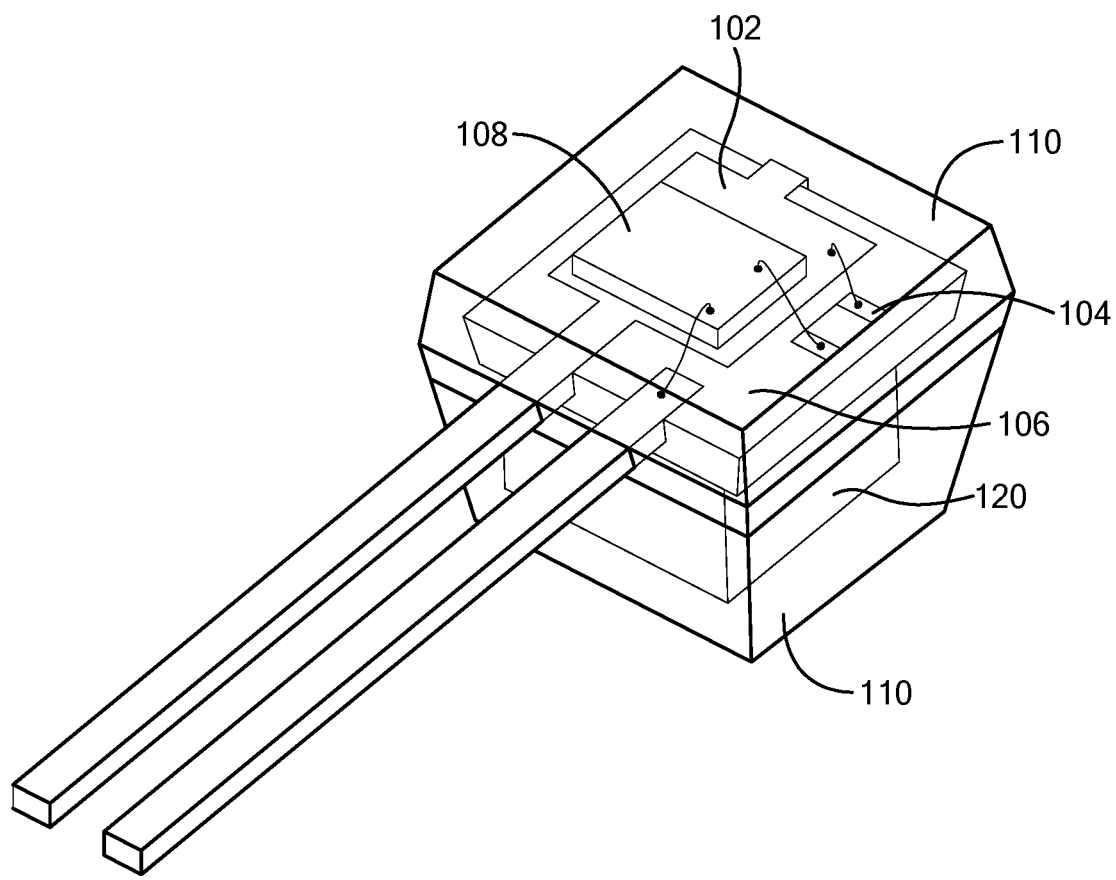
FIG. 3E is a partially transparent view of a sensor IC package having a magnet fabricated in accordance with example embodiments of the invention.

As can be seen, in an example embodiment, a surface of the lead frame 102 is level with the pre-mold material, which was applied while the film 150 (FIG. 2B) was present. The leadframe 102 and passive component 104 are set to the same plane to allow connection to the film 150 which prevents mold contamination on these surfaces. This allows both the leadframe 102 and the passive component 104 to be wire bonded 112 to each other. In addition, these components can be connected using a bumped chip and reflowed. U.S. Patent Publication No. 2019/0157465, which is incorporated herein by reference, shows example bumped chip embodiments. As can also be seen, the passive component 104 is generally in the same plane as the leadframe 102. This allows the passive component 104 to be wire bonded 112 or a bumped connection to be made. FIG. 3E shows the sensor IC package of FIG. 2C with the addition of a back bias magnet 120.

With this arrangement, which is enabled by the film 150, a profile is achieved that is less than for conventional sensor IC packages. Example thicknesses are shown in FIG. 2B, where a first thickness T1 of the leadframe 102 is in the order of 0.35 mm, a second thickness T2 of the passive component 104 is in the order of 0.5 mm, and a third thickness T3 of the pre-mold material 106 is in the order of 0.65 mm. Example thickness shown in FIG. 1A include a package thickness having a first package thickness PT1 from a bottom of the die 108 to the top of the package in the order of 0.5 mm and a second package thickness PT2 from a bottom of the die to the bottom of the package in the order of about 0.75 mm, for a total package thickness of about 1.25 mm. It will be readily appreciated by one skilled in the art that thinner sensor IC packages are often desirable. The film 150 allows the pre-mold 106 to be completed while keeping the surfaces of the leadframe 102 and passive component 104 contaminant free. As a result, the completed package is thinner than conventional IC packages by allowing the passive component 104 to be within the plane of the leadframe 102. This process then allows the die 108 to be less than the height of the passive component 104 because they are no longer on the same side of leadframe 102.

It is understood that any practical number of components can be secured to the film and connected to the die or other components. This can include passive electrical components such as resistors, inductors and capacitors, as well as passive magnetic elements, such as magnets, ferrous shields or shunts. In some embodiments, first and second capacitors and/or inductors, RLC circuits and the like, are wirebonded to the leadframe or other location. It is understood that any practical number of capacitors and components in general at least partially covered by pre-mold material can be used to meet the needs of a particular application.

Leadframes 104 can be laminated to the film via multiple processes using heat and/or pressure. After the molding of the pre-mold 106 the film is removed using a process appropriate for the film 150. This can be with heat or UV being applied to the film 150 as it is stripped from the assembly. This film can have the passive component(s) 104 applied by pick and place machines on the film 150 in selected locations relative to the leadframe 102. The placement tools can be designed with limits for pressure and time. This will allow the passive component(s) 104 to be located on the film 150 as needed.

Figure 4:
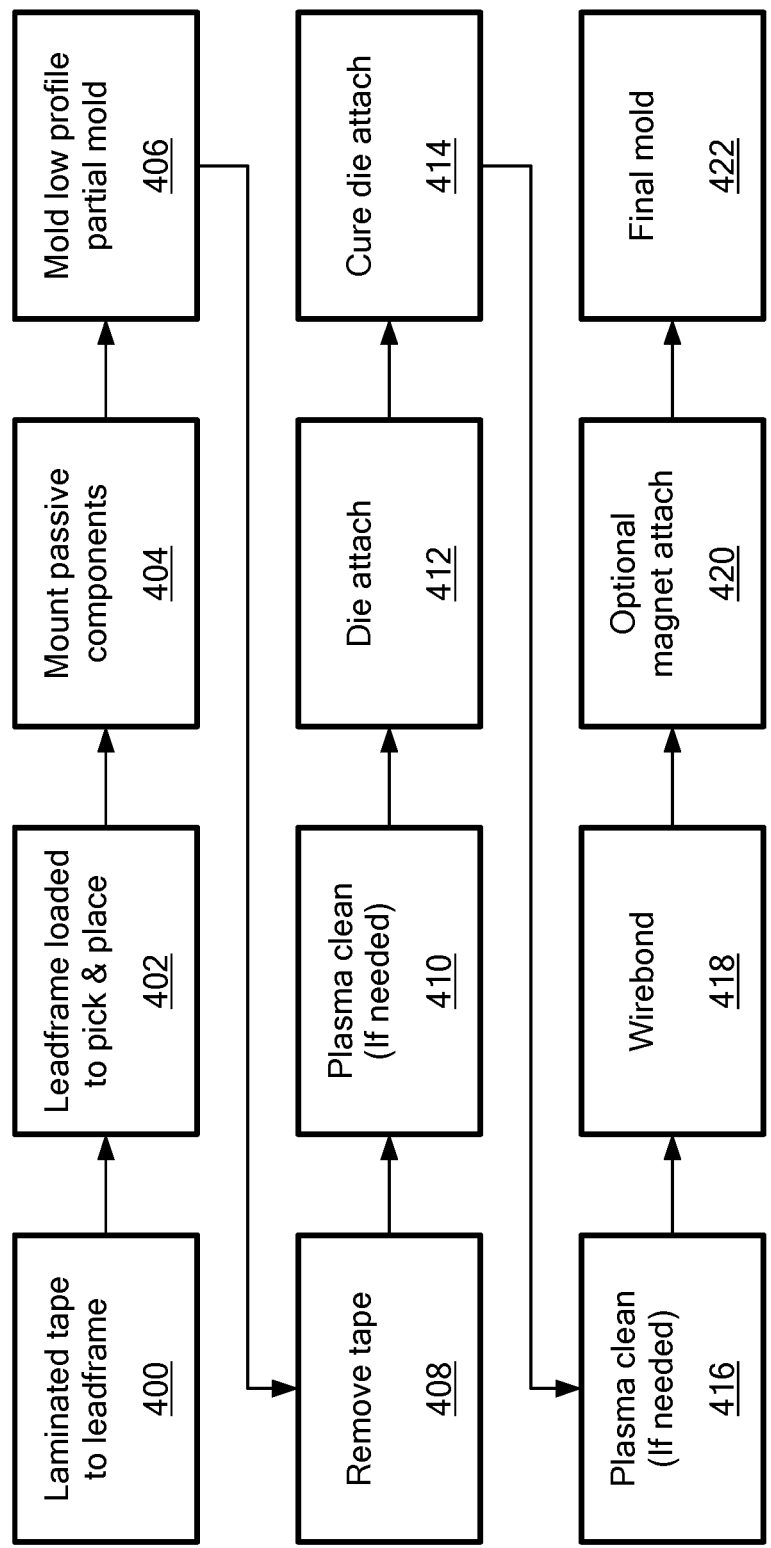
FIG. 4 is a process flow diagram for providing a sensor IC package in accordance with example embodiments of the invention.

FIG. 4, in conjunction with FIGS. 1A-3E, show an example process flow for providing a low-profile sensor package in accordance with illustrative embodiments of the invention. In step 400, film/tape is laminated to a leadframe 102 and the assembly is loaded to a pick and place machine, for example, in step 402. In step 404, passive components 104 are mounted onto the film to provide an assembly. In step 406, a pre-mold material 106 is applied to the assembly to cover the leadframe 102 and passive component 104 while leaving a surface of the leadframe and a portion of the passive component exposed.

In step 408, the film/tape is removed from the assembly. In optional step 410, the assembly can be clean, such as with a suitable plasma cleaning process. In step 412, a die 108 is attached to the exposed leadframe 102 and cured in step 414. In optional step 416, the assembly is cleaned if needed. In step 418, wirebonds 112 can be attached to make electrical connections between the die and leadframe portions. In optional step 420, a magnet 120 can be attached to the pre-mold material 106 on an opposite side of the leadframe 102 as the die 108. In step 422, the assembly can be encapsulated with a final mold material.

It is understood that a lead frame can having a wide range of configurations to meet the needs of a particular application. The leadframe can include any practical number of non-contiguous portions and any practical number of lead fingers to provide external connections.

FIG. 5 shows an example leadframe 510 which can be secured to a film, as described above, to provide a low-profile sensor IC package. The leadframe 510 can include a plurality of leads 514, 516, 518 at least two of which (and here, all three) include a respective die attach portion 524, 526, 528 and connection portion 534, 536, 538. The lead frame 510 has a first surface 510a and a second, opposing surface. As will be explained, the die attach portion 524, 526, 528 of the leads (referred to herein sometimes as simply the die portion) can support a semiconductor die (not shown). While the lead frame 510 is shown to include three leads 514, 516, 518, it will be appreciated by those of ordinary skill in the art that various numbers of leads, such as between two and eight, are possible.

The connection portion 534, 536, 538 of the leads extends from a first end 534a, 536a, 538a proximate to the respective die portion 524, 526, 528 to a second, distal end. Generally, the connection portion 534, 536, 538 of the leads is elongated and is suitable for making electrical connection to electronic systems and components (not shown) outside of the integrated circuit package, such as a power source or microcontroller.

The lead frame 510 may have tie bars 546, 547 549 to hold the leads 514, 516, 518 together during manufacture. Tie bar 546 is positioned near the die portion 524, 526, 528 of the leads and the first end 534a, 536a, 538a of the connection portions. Another tie bar portion is shown at 547 at the opposite side of the die portion 524, 526, 528 from the lead ends 534a, 536a, 538a. Another tie bar portion is shown at 549 on the outer side of the die portions 524, 528. In addition to facilitating manufacture, the tie bar(s) can also serve to protect the leads during handling, for example, by maintaining coplanarity of the elongated connection portions 534, 536, 538.

The lead frame 510 may be formed from various materials and by various techniques, such as stamping or etching. As one example, the lead frame 510 is a copper lead frame pre-plated with NiPdAu. Other suitable materials for the lead frame include but are not limited to aluminum, copper, copper alloys, titanium, tungsten, chromium, Kovar™, nickel, or alloys of the metals. Furthermore, the lead frame 10 may be comprised of a non-conductive substrate material, such as a standard PC board with FR-4 and copper traces, or a Kapton material with copper or other metal traces (for example a flexible circuit board).

The lead and lead frame dimensions can be readily varied to suit particular application requirements. In one illustrative example, the leads 514, 516, 518 have a thickness on the order of 0.25 mm and the connection portions 534, 536, 538 are on the order of 16 to 18 mm long. In other embodiments the thickness of the material may be less or more than 0.25 mm, for example a range of 0.1 mm to 0.5 mm. The length of the leads may also be longer or shorter than described above for example on the order of 10 mm to 25 mm. Typically, the lead frame which will be used to form a single integrated circuit, is formed (e.g., stamped) with a plurality of other identical or similar lead frames in a single stamping process for example, and the lead frames separated during manufacture for formation of individual integrated circuits. The lead frame may be flexible or rigid, depending on the material, dimensions, and requirements. Example leadframe materials include metals, such as copper, and/or soft ferromagnetic materials, including but not limited to Kovar.

In the illustrated embodiment, the die attach portion of one or more of the leads (here, illustrative die attach portions 524 and 528 of respective leads 514, 518) includes at least two separate portions. Die attach portion 524 includes two separate portions 524a and 524b, each of which has an end that is spaced from and proximate to the end of the other lead portion. Similarly, die attach portion 528 includes two separate portions 528a and 528b, each of which has an end that is spaced from and proximate to the end of the other lead portion.

The die attach portion of one or more of the leads further may further include at least one separating feature, here labeled 532, that serves to separate areas of a die attach portion from each other. The separating features 532 are provided in order to prevent solder or other material from adversely impacting adjacent solder or other connections to other elements. If the die were electrically attached to the lead frame through a flip-chip or other solder process the separating features 532 would prevent the solder or attach material (maybe a conductive epoxy in some embodiments) from adversely impacting other attachment areas of the lead frame. The separating features 532 may take various forms. As examples, the separating features 532 may be recessed or raised areas. The illustrative separating features 532 are recessed areas, such as may be formed by etching, partial etching, coining, or stamping.

The lead frame 510 and more particularly one or more of the die attach portions 524, 526, 528 may contain one or more slots (not shown). As is well known, in the presence of a changing, AC or transient magnetic field (e.g., a magnetic field surrounding a current carrying conductor), eddy currents can be induced in a conductive lead frame. Slots can move the position of the eddy currents and also reduce a size (e.g., a diameter or path length) of the closed loops in which the eddy currents travel in the lead frame to result in a smaller magnetic field error so that a Hall effect element experiences a smaller magnetic field from the eddy currents than it would otherwise experience, resulting in less error in the measured field and enhanced overall performance of the sensor. Details of a slotted lead frame may be found in U.S. Patent Application Publication No. 2012/0086090 for example, which application is incorporated herein by reference in its entirety.

Various techniques and materials can be used to attach a die to the die attach portions 524, 526, 528. Since the die 540 is attached across multiple leads 514, 516, 518, the mechanism for attaching the die to the lead frame 510 can include non-conductive adhesive and may take various forms, such as a non-conductive, electrically insulative adhesive, such as a thermoset adhesive (e.g., a two part epoxy), epoxy, tape, such as a Kapton® tape, or die attach film.

In addition to the magnetic field sensing element, the die may support other electronic components and circuitry, and the sensing element and other electronic components supported by the die can be coupled to the leads 514, 516, 518 by various techniques, such as by solder balls, solder bumps, pillar bumps, or the illustrated wire bonds. If solder balls, solder bumps, or pillar bumps are used, the die may be attached to the die attach portions 524, 526, 528 with the active die surface (in which the magnetic field sensing element is disposed) adjacent to the lead frame surface 510a, as in a flip-chip arrangement.

While a die, such as die 108 in FIG. 1A, may be used to form a magnetic field sensor and, may support at least one magnetic field sensing element 114, it will be appreciated by those of ordinary skill in the art that the integrated circuit packaging described herein can be used in connection with other types of integrated circuits. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR, including spin-valve structures) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The integrated circuit shown during and after manufacture in FIGS. 1A-3E may include at least one integrated passive component 104, such as a resistor, inductor, capacitor, Transient Voltage Suppressor (TVS), diode (including, but not limited to Zener diode). Passive components 104, such as capacitors, may be desirable for filtering and/or other functionality, and may be useful to reduce EMC, ESD or address other electrical issues with the resulting sensor. For example, with capacitors 104 power to the sensor may be held longer in order to prevent a power on reset state by holding an output state in the case of a broken or damaged wire. It is possible to have other types of passive components coupled between different leads and/or between the same leads in parallel. For example, one capacitor may be coupled between a power lead and a ground lead and another capacitor may be coupled between an output lead and a ground lead. While two capacitors are shown in FIG. 3A, for example, it will be appreciated that any number of capacitors or other passive components may be used as desirable for a particular application.

The integrated circuit subassembly shown during manufacture in FIGS. 1B and 3E includes a separately formed ferromagnetic element 120 adjacent to the lead frame 10. In use, a magnetic field sensor containing the subassembly may be positioned in proximity to a moveable magnetically permeable ferromagnetic article, or target (not shown), such that the magnetic field transducer is adjacent to the article and is thereby exposed to a magnetic field altered by movement of the article. The target may be comprised of a hard ferromagnetic, or simply hard magnetic material (i.e., a permanent magnet such as a segmented ring magnet), a soft ferromagnetic material, or even an electromagnet and sensor embodiments described herein may be used in conjunction with any such target arrangements. The magnetic field transducer generates a magnetic field signal proportional to the magnetic field.

The ferromagnetic element 120 may take various forms selected to enhance the magnetic field sensing capability and/or performance of the sensor based on attributes of the adjacent target, application specifications and requirements and other factors. In the embodiment of FIGS. 1A and 3E, the ferromagnetic element 120 comprises a magnet (hard ferromagnetic material) attached adjacent to the lead frame/pre-mold material.

Various materials and techniques are suitable for providing the ferromagnetic element attachment, such as a non-conductive, electrically insulative adhesive, such as a thermoset adhesive (e.g., a two part epoxy), epoxy, tape, such as a Kapton® tape, film, or spray. In some cases the tape may have a single sided adhesive layer, while in others a double-sided adhesive tape may be used. Furthermore, the ferromagnetic element attachment mechanism may comprise a combination of materials and layers, such a layer of Kapton® tape.

The magnet may be comprised of a hard ferromagnetic or simply hard magnetic material (i.e., a permanent magnet such as a segmented ring magnet) to form a bias magnet. In embodiments in which the magnet forms a bias magnet and in which the sensor is oriented relative to the target such that transducer is closer to the target than the magnet, the bias magnet may be referred to as a back bias magnet. This arrangement is well suited for embodiments in which the target is comprised of a soft ferromagnetic material. The magnet may also comprise a hard magnetic material or permanent magnet in embodiments in which the magnetic field sensing element is a magnetoresistance element and a bias field is desired.

Illustrative hard magnetic materials for the magnet include, but are not limited to hard magnetic ferrites, SmCo alloys, NdFeB alloy materials, or Plastiform® materials of Arnold Magnetic Technologies Corp., or other plastic compounds with hard magnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON® EME of Sumitomo Bakelite Co., Ltd or similar type of thermoset mold material containing hard magnetic particles. In some embodiments it may be desirable to align the hard ferromagnetic particles during molding or sintering to form a more anisotropic or directional permanent magnetic material by molding or sintering in the presence of a magnetic field; whereas, in other embodiments, a sufficient magnet may result without an alignment step during molding for isotropic materials. It will be appreciated that a NdFeB or a SmCo alloy may contain other elements to improve temperature performance, magnetic coercivity, or other magnetic properties useful to a magnetic design. In some embodiments, including but not limited to NiFeB magnets, a coating such an electroplated Nickel layer may be applied to the surface of the magnet 66 to prevent or reduce corrosion of the magnet.

The magnet may be formed by sintering or other suitable method, such as compression molding, injection molding, and transfer molding, and potting. It will be appreciated that the magnet may be magnetized in multiple directions, either perpendicular or parallel to the die surface in an x, y, and/or z direction. Other off-axis directions may also be used to magnetize the magnet for specific applications. The magnetic properties for an anisotropic magnet will be optimal when the magnetization direction is aligned with the direction of field applied during manufacturing, but these two directions need not be used in all cases to manufacture a useful device. The magnet may have various shapes and dimensions. For example, the magnet may be provided in the form of a ring-like structure as may be described as having an "O" or "U" shape or a partial ring-like structure as may be described as having a "C" or "U" shape. In embodiments in which the magnet has a non-contiguous central region, the central region may be an open area or may contain a ferromagnetic material or a separately formed element, such as a steel rod for example.

During overmolding, a non-conductive mold material is used to encapsulate the assembly after film removal to encloses the semiconductor die 108 and a portion of the leads and die attach portion of the leadframe 102. The non-conductive molded enclosure may be formed by various techniques, including but not limited to injection molding, compression molding, transfer molding, and/or potting, from various non-conductive mold materials, such as Sumitomo FGT700. In general, the non-conductive mold material 110 is comprised of a non-conductive material so as to electrically isolate and mechanically protect the die and the enclosed portion of the lead frame 102 and pre-mold material 106. Suitable materials for the non-conductive mold material 110 include thermoset and thermoplastic mold compounds and other commercially available IC mold compounds. It will be appreciated that the non-conductive mold material, while typically non-ferromagnetic, can contain a ferromagnetic material, such as in the form of ferromagnetic particles, as long as such material is sufficiently non-conductive.

Having described preferred embodiments of the invention it will now become apparent to those of ordinary skill in the art that other embodiments incorporating these concepts may be used.

For example, it will be appreciated by those of ordinary skill in the art that the package types, shapes, and dimensions, can be readily varied to suit a particular application both in terms of the electrical and magnetic requirements as well as any packaging considerations. It will also be appreciated that the various features shown and described herein in connection with the various embodiments can be selectively combined. For example, any of the lead frame embodiments described herein can be used with any suitable ferromagnetic element configuration.

Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A method, comprising:
    applying a film to a leadframe having first and second surfaces, wherein the film is applied to the second surface of the leadframe;
    mounting at least one component to the film;
    applying a pre-mold material to cover at least a portion of the first surface of the leadframe and the at least one component;

removing the film to expose the second surface of the leadframe;
attaching a die to the second surface of the leadframe;
forming at least one electrical connection between the die and the leadframe; and
encapsulating the die, the leadframe, the at least one component and the pre-mold material with a final mold material to provide an IC package.

2. The method according to claim 1, further including attaching a magnet to the opposite side of the leadframe as the die.

3. The method according to claim 1, wherein the at least one component comprises one or more of a capacitor, resistor, inductor, and/or coil.

4. The method according to claim 1, wherein the at least one component comprises one or more active components.

5. The method according to claim 4, wherein the one or more active component comprises a transistor, transducer, and/or circuit.

6. The method according to claim 1, further including a magnetic field sensing element coupled to the die.

7. The method according to claim 1, wherein the at least one component and the leadframe are substantially co-planar.

8. The method according to claim 1, wherein the at least one electrical connection comprises a wirebond.

9. The method according to claim 1, wherein a thickness of the IC package is less than 1.25 mm.

10. The method according to claim 9, wherein a total thickness of the leadframe and the pre-mold material is less than about 0.75 mm.

11. The method according to claim 10, wherein a thickness of the leadframe is less than about 0.35 mm.

12. The method according to claim 1, wherein the IC package has exactly two leads.

13. The method according to claim 1, wherein the IC package has exactly three leads.

14. The method according to claim 1, further including attaching a magnet to the opposite side of the leadframe as the die, wherein the magnet abuts the pre-mold material.

15. The method according to claim 1, further including providing wirebonds between the die and the leadframe, applying the pre-mold material, and then providing wirebonds to the at least one component, which is on an opposite side of the leadframe as the die.

16. The method according to claim 1, wherein the at least one component is secured in position by the pre-mold material.

17. The method according to claim 1, further including connecting the at least one component to the leadframe with a wirebond.

18. The method according to claim 1, wherein the at least one component includes first and second passive components with respective wirebonds.

19. The method according to claim 1, wherein the portion of the leadframe attached to the die comprises a non-conductive material.

20. An IC package fabricated in accordance with claim 1.

21. A method comprising:
employing a film having first and second surfaces;
mounting at least one component to the first surface of the film;
mounting leadframe portions to the first surface of the film;
applying a pre-mold material on the first surface of the film to cover at least a portion of the passive component and the at least one of the leadframe portions;
removing the film;
attaching a die to the premold material;
forming at least one electrical connection from the at least one component to one of the leadframe portions and/or the die; and
encapsulating the die, the at least one component, and the pre-mold material with a final mold material to provide an IC package.

22. The method according to claim 21, wherein the at least one component comprises one or more of a capacitor, resistor, inductor, coil, transistor, transducer and/or circuit.

23. The method according to claim 21, wherein the die includes a magnetic field sensing element.

24. The method according to claim 21, wherein the at least one electrical connection comprises a wirebond.

25. The method according to claim 21, wherein a thickness of the IC package is less than 1.25 mm.

26. The method according to claim 21, further including providing wirebonds between the die and the leadframe portions, applying the pre-mold material, and then providing wirebonds to the at least one component.

27. The method according to claim 21, wherein the at least one component is secured in position by the pre-mold material.

28. An IC package, comprising:
a leadframe having first and second surfaces;
at least one component supported by the leadframe;
a pre-mold material covering at least a portion of the first surface of the leadframe and the at least one component and securing the at least one component in position;
a die supported by the second surface of the leadframe;
at least one electrical connection between the die and the leadframe; and
encapsulant encapsulating the die, the leadframe, the at least one component, and the pre-mold material to provide an IC package,
wherein a thickness of the IC package is less than about 1.25 mm.

29. The IC package according to claim 28, further including a magnet on the opposite side of the leadframe as the die.

30. The IC package according to claim 28, wherein the at least one component comprises one or more of a capacitor, resistor, inductor, coil, active component, transistor, transducer, and/or circuit.

31. The IC package according to claim 28, further including a magnetic field sensing element on or about the die.

32. The IC package according to claim 28, wherein the at least one component and the leadframe are substantially co-planar.

33. The IC package according to claim 28, wherein the at least one electrical connection comprises a wirebond.

34. The IC package according to claim 28, wherein a total thickness of the leadframe and the pre-mold material is less than about 0.75 mm.

35. The IC package according to claim 34, wherein a thickness of the leadframe is less than about 0.35 mm.

36. The IC package according to claim 28, wherein the IC package has exactly two leads.

37. The IC package according to claim 28, wherein the IC package has exactly three leads.

38. The IC package according to claim 28, further including a magnet at the opposite side of the leadframe as the die, wherein the magnet abuts the pre-mold material.

* * * * *